United States Patent
Oh et al.

(10) Patent No.: US 9,348,066 B2
(45) Date of Patent: May 24, 2016

(54) FILM FOR IMPROVING COLOR DISPLAY AND METHOD OF MANUFACTURING THE SAME

(71) Applicant: Samsung Electronics Co., Ltd., Suwon-Si, Gyeonggi-Do (KR)

(72) Inventors: Young Oh, Uiwang-si (KR); Hyun-min Kim, Uiwang-si (KR); Young-hyun Ju, Uiwang-si (KR); Seung-man Choi, Uiwang-si (KR); You-min Shin, Gyeongsangbuk-do (KR); Hong-shik Shim, Seoul (KR); Chul-ho Jeong, Gwangju-si (KR); Eun-young Cho, Gyeongsangbuk-do (KR)

(73) Assignees: Samsung Electronics Co., Ltd., Gyeonggi-do (KR); Samsung Corning Precision Materials Co., Ltd., Chungcheongnam-do (KR); Cheil Industries Inc., Gyeongsangbuk-do (KR)

( * ) Notice: Subject to any disclaimer, the term of this patent is extended or adjusted under 35 U.S.C. 154(b) by 0 days.

(21) Appl. No.: 14/200,914

(22) Filed: Mar. 7, 2014

(65) Prior Publication Data
US 2014/0252331 A1 Sep. 11, 2014

(30) Foreign Application Priority Data

Mar. 8, 2013 (KR) .................. 10-2013-0025314
May 31, 2013 (KR) .................. 10-2013-0063019

(51) Int. Cl.
*H01L 51/52* (2006.01)
*G02B 5/02* (2006.01)
*G02B 3/00* (2006.01)

(52) U.S. Cl.
CPC .............. *G02B 5/0242* (2013.01); *G02B 3/005* (2013.01); *G02B 5/0268* (2013.01); *H01L 51/5275* (2013.01); *H01L 51/5265* (2013.01); *Y10T 156/1039* (2015.01)

(58) Field of Classification Search
CPC .. H01L 51/5275; G02B 3/005; G02B 3/0056; G02B 3/0068; G02B 5/0236; G02B 5/0242; G02B 5/0278; Y10T 428/24521
See application file for complete search history.

(56) References Cited

U.S. PATENT DOCUMENTS

2006/0209403 A1* 9/2006 Parusel et al. .................. 359/453
2007/0035839 A1* 2/2007 Ibuki ............................. 359/582

(Continued)

FOREIGN PATENT DOCUMENTS

KR 10-0512193 B1 8/2005
KR 2011-0034926 A 4/2011

(Continued)

*Primary Examiner* — Khaja Ahmad
(74) *Attorney, Agent, or Firm* — Harness, Dickey & Pierce, P.L.C.

(57) ABSTRACT

Provided are a color display film and a method for manufacturing the same, and a display apparatus. The color display film includes a base material layer, a high-refractive resin layer on which an optical pattern is formed, and a low-refractive light diffusion layer including a light diffuser in a stacked configuration. The optical pattern is formed in one surface of the high-refractive resin layer facing the low-refractive light diffusion layer. The method of manufacturing a color display film includes forming a high-refractive resin layer by coating a high-refractive transparent resin on one surface of a base material layer and forming an imprinted optical pattern on the coated high-refractive transparent resin, forming a low-refractive light diffusion layer by dispersing a light diffuser into a low-refractive transparent resin, and bonding one surface of the low-refractive light diffusion layer on a surface on which the optical pattern is formed.

19 Claims, 5 Drawing Sheets

(56) References Cited

U.S. PATENT DOCUMENTS

| | | | |
|---|---|---|---|
| 2007/0146887 A1* | 6/2007 | Ikeda et al. | 359/586 |
| 2009/0066219 A1* | 3/2009 | Handa et al. | 313/503 |
| 2009/0128738 A1* | 5/2009 | Matsumoto et al. | 349/64 |
| 2009/0176084 A1* | 7/2009 | Yoshihara et al. | 428/313.3 |
| 2011/0256312 A1* | 10/2011 | Suzuki et al. | 427/164 |

FOREIGN PATENT DOCUMENTS

| | | |
|---|---|---|
| KR | 10-1080397 B1 | 11/2011 |
| KR | 2012-0082172 A | 7/2012 |
| KR | 10-1200770 B1 | 11/2012 |

* cited by examiner (a)

(b)

(a)

(b)

FILM FOR IMPROVING COLOR DISPLAY AND METHOD OF MANUFACTURING THE SAME

RELATED APPLICATIONS

This application claims priority from Korean Patent Application No. 10-2013-0025314, filed on Mar. 8, 2013, and Korean Patent Application No. 10-2013-0063019, filed on May 31, 2013, in the Korean Intellectual Property Office, the disclosures of which are incorporated herein in their entirety by reference.

BACKGROUND

1. Field

Example embodiments of the present disclosure relate to a film for improving color display and/or a method for manufacturing the same, and more particularly, to an improved color display film having a small change in color display according to a viewing angle and a method for manufacturing the same, and/or a display apparatus including the improved color display film.

2. Description of the Related Art

In liquid crystal light emitting devices, a panel in which liquid crystals for a display screen are regularly arranged in tempered flat glass may be disposed, and a backlight may emit light into the panel to display colors and images on the screen.

Such a liquid crystal light emitting device has improved image quality and low manufacturing costs. However, the liquid crystal light emitting device may have a complex manufacturing process, a relatively low response speed, a narrow viewing angle, and high power consumption.

Organic light emitting diode (OLED) displays are typically considered next generation displays for complementing the above-described faults of the liquid crystal displays (LCDs). An OLED display may have a light-emitting property in which light is emitted when current is applied to a fluorescent organic compound. Thus, the OLED display may display colors in such a way that red R, green G, and blue B colors are displayed according to organic materials. The OLED may have high resolution, wide viewing angle, low power consumption, and fast response speed in order to display natural images without the disadvantage of afterimages. Thus, the OLED is being widely used for portable devices and general digital televisions.

Korean Patent Publication No. 2012-0081362 discloses a structure including a background layer that is layered to improve a change in color display according to a viewing angle of an LCD.

SUMMARY

At least one example embodiment includes an improved color display film having a small change in color display according to a viewing angle.

At least one example embodiment includes a color sense improving film having improved light transmittance and diffusion.

Provided is an example color display film having improved reliability.

At least one example embodiment includes a method for manufacturing a color display film having increased processability and economic feasibility.

Provided is an example display apparatus including a color display film.

Additional aspects will be set forth in part in the description which follows and, in part, will be apparent from the description, or may be learned by practice of the example embodiments.

According to an example embodiment, a color display film includes a base material layer; a high-refractive resin layer on which an optical pattern is formed; and a low-refractive light diffusion layer including a light diffuser, wherein the base material layer, the high-refractive resin layer, and the low-refractive light diffusion layer are sequentially stacked, and the optical pattern is imprinted or formed on one surface of the high-refractive resin layer facing the low-refractive light diffusion layer.

The high-refractive resin layer may include an ultraviolet hardening transparent resin having a refractive index of about 1.50 to about 1.60.

The low-refractive light diffusion layer may include an ultraviolet hardening transparent resin having a refractive index of about 1.35 to about 1.45.

The optical pattern may be constituted by a plurality of lenticular concave lenses, and each of the lenticular concave lenses may have a width (D) of about 1 μm to about 1,000 μm, a depth (H) of about 1 μm to about 2,000 μm, and an aspect ratio (H/D) of about 1 to about 3.

The plurality of lenticular concave lenses may be spaced apart by a distance L therebetween, and a ratio (L/D) of the spaced distance (L) to the width (D) of the lenticular concave lens may be about 3.0 or less.

Each of the high-refractive resin layer and the low-refractive resin layer may be an ultraviolet hardening resin having an acrylate-based functional group.

The light diffuser may be one of an organic-based light diffuser, an inorganic-based light diffuser, and a mixture thereof. The organic-based light diffuser may include at least one of acrylic-based particles, siloxane-based particles, melamine-based particles, polycarbonate-based particles, and styrene-based particles. The inorganic-based light diffuser may include at least one of calcium carbonate, barium sulfate, titanium dioxide, aluminum hydroxide, silica, glass, talcum, mica, white carbon, magnesium oxide, and zinc oxide.

The organic-based light diffuser may have an average particle size (D50) of about 2 μm to about 20 μm.

The organic-based light diffuser may include polymer particles that are coated with a black dye, and non-coated particles. The polymer particles that are coated with the black dye may be poly methyl methacrylate (PMMA) particles, and the non-coated particles may be one of silicon particles, acrylic-based particles, and a mixture thereof.

The organic-based light diffuser may include the polymer particles that are coated with the black dye, and the non-coated particles, mixed at a weight ratio of about 1:4 to about 4:1.

The light diffusion layer may include the light diffuser at a concentration of about 0.1 weight % to about 10 weight %.

The base material layer may have a thickness of about 30 μm to about 100 μm, the high-refractive resin layer may have a maximum thickness of about 5 μm to about 80 μm, and the low-refractive light diffusion layer may have a thickness of about 5 μm to about 50 μm.

An adhesive layer may be further stacked on one surface of the low-refractive light diffusion layer. The base material layer may include triacetate cellulose (TAC), polyethylene terephthalate (PET), polycarbonate (PC), or polyvinyl chloride (PVC). According to another example embodiment, a method for manufacturing a color display film includes forming a high-refractive resin layer by coating a high-refractive transparent resin on one surface of a base material layer and forming an imprinted optical pattern in the coated high-refractive transparent resin; forming a low-refractive light diffusion layer by dispersing a light diffuser into a low-refractive transparent resin; and bonding one surface of the low-refractive light diffusion layer on a surface of the high-refractive resin layer on which the optical pattern of the high-refractive resin layer is formed.

The method may further include forming an adhesive layer by coating an adhesive on the other surface of the low-refractive resin layer.

The high-refractive transparent resin may be an ultraviolet hardening transparent resin having a refractive index of about 1.50 to about 1.60, and the low-refractive transparent resin may be an ultraviolet hardening transparent resin having a refractive index of about 1.35 to about 1.45.

According to another example embodiment, an organic light-emitting device display apparatus includes a first electrode; a second electrode facing the first electrode; an organic light emission film disposed between the first electrode and the second electrode; and a color display film disposed on a light emission surface of the second electrode, wherein the color display film is the color display film discussed above, and the organic light-emitting device display apparatus has a resonant structure to display an image by using a color reflected from each pixel of the organic light emission film.

The organic light emission film may include a hole injection layer (HIL), a hole transport layer (HTL), an emission layer (EML), an electron transport layer (ETL), and an electron injection layer (EIL), which may be sequentially stacked.

BRIEF DESCRIPTION OF THE DRAWINGS

These and/or other aspects will become apparent and more readily appreciated from the following description of the example embodiments, taken in conjunction with the accompanying drawings in which.

DETAILED DESCRIPTION

Figure 1:
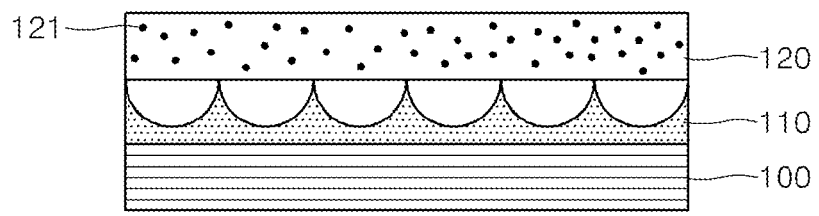
FIG. 1 is a cross-sectional view of a color display film according to an example embodiment.

Reference will now be made in detail to embodiments, examples of which are illustrated in the accompanying drawings, wherein like reference numerals refer to like elements throughout. In this regard, the present example embodiments may have different forms and should not be construed as being limited to the descriptions set forth herein. Accordingly, the example embodiments are merely described below, by referring to the figures, to explain aspects of the present description. Expressions such as "at least one of," when preceding a list of elements, modify the entire list of elements and do not modify the individual elements of the list.

It will be understood that when an element is referred to as being "on," "connected" or "coupled" to another element, it can be directly on, connected or coupled to the other element or intervening elements may be present. In contrast, when an element is referred to as being "directly on," "directly connected" or "directly coupled" to another element, there are no intervening elements present. As used herein the term "and/or" includes any and all combinations of one or more of the associated listed items. Further, it will be understood that when a layer is referred to as being "under" another layer, it can be directly under or one or more intervening layers may also be present. In addition, it will also be understood that when a layer is referred to as being "between" two layers, it can be the only layer between the two layers, or one or more intervening layers may also be present.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

In the drawing figures, the dimensions of layers and regions may be exaggerated for clarity of illustration. Like reference numerals refer to like elements throughout. The same reference numbers indicate the same components throughout the specification.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein. As used herein, expressions such as "at least one of," when preceding a list of elements, modify the entire list of elements and do not modify the individual elements of the list.

Reference will now be made in detail to embodiments, examples of which are illustrated in the accompanying drawings, wherein like reference numerals refer to the like elements throughout. In this regard, the present embodiments may have different forms and should not be construed as being limited to the descriptions set forth herein. Accordingly, the embodiments are merely described below, by referring to the figures, to explain example embodiments of the present description.

Hereinafter, a color display film and a method for manufacturing the same, and a display apparatus including the color display film according to example embodiments will be described in detail with reference to the accompanying drawings.

In the drawings, the thicknesses of lines and sizes of elements are exaggerated for clarity and convenience. Also, terms used in this specification are terms defined in consideration of functions according to embodiments, and thus the terms may be changed according to the intention or usage of a user or operator. Therefore, the terms should be defined on the basis of the overall contents of this specification.

First, a color display film according to example embodiments will be described.

Color Display Film

FIG. 1 is a cross-sectional view of a color display film according to an example embodiment.

According to at least one example embodiment, referring to FIG. 1, a color display film includes a base material layer 100, a high-refractive resin layer 110 on which an optical pattern is formed, and a low-refractive light diffusion layer 120 including a light diffuser 121. The base material layer 100, the high-refractive resin layer 110, and the low-refractive light diffusion layer 120 may be sequentially stacked. The color display film of FIG. 1 has a structure in which the optical pattern is formed on one surface of the high-refractive resin layer 110 facing the low-refractive light diffusion layer 120.

The base layer 100 may be a transparent resin film or glass substrate having an ultraviolet light transmitting property and a light incident surface and a light emission surface facing the light incident surface. The base material layer 100 may include triacetate cellulose (TAC), polyethylene terephthalate (PET), polycarbonate (PC), or polyvinyl chloride (PVC). The base material layer 100 may be a single layer or a multi layer. The base material layer 100 may have a thickness of about 30 μm to about 100 μm.

The high-refractive resin layer 110 on which the optical pattern is formed may include the high-refractive resin layer 110 and the optical pattern formed on one surface of the high-refractive resin layer 110. The high-refractive resin layer 110 may be formed of a UV hardening transparent resin that is hardened by UV. The UV hardening transparent resin may have a refractive index of about 1.50 to about 1.60.

The optical pattern may be imprinted or formed on one surface of the high-refractive resin layer 110 facing the low-refractive light diffusion layer 120. The imprinted optical pattern may have at least one shape selected from the group consisting of a cone, a cone frame, a micro lens, a cylinder lens, a prism, and a round prism, but is not limited thereto. Light having high color purity incident into the panel may be emitted in a direction perpendicular to the light emission surface. Here, the micro concave lens may be used to more widely diffuse the incident light having the high color purity. The micro concave lens may have one of a semicircular sectional lenticular lens, a semicircular sectional dot lens, a semicircular sectional strip lens, and a semicircular sectional wave lens. For example, the micro concave lens may be the semicircular sectional lenticular lens.

Figure 2:
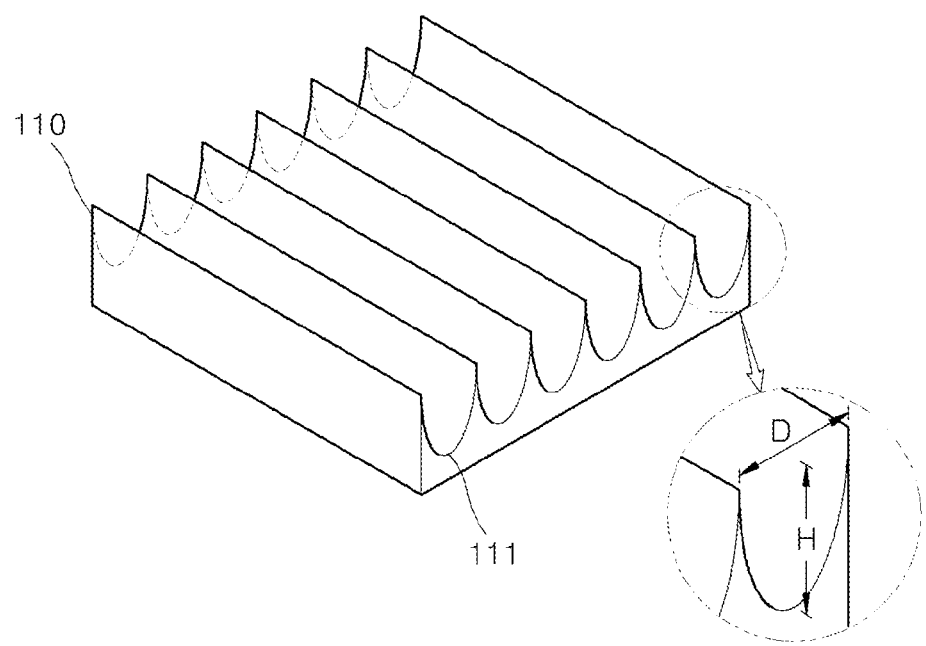
FIG. 2 is a perspective view of a high-refractive resin layer on which an optical pattern is formed according to an example embodiment.

FIG. 2 is a perspective view of the high-refractive resin layer on which the optical pattern is formed according to an example embodiment, i.e., illustrates an example to which the optical pattern constituted by a plurality of lenticular concave lenses 111 is applied.

According to at least one example embodiment, referring to FIG. 2, the lenticular concave lens 111 may be imprinted on one surface of the high-refractive resin layer 110. The lenticular concave lens 111 may have a semicircular sectional shape having a width D and a depth H. The lenticular concave lens 111 may have a width D of about 1 μm to about 1,000 μm and a depth H of about 1 μm to about 2,000 μm. When an aspect ratio of the lenticular concave lens is defined as H (lens depth)/D (lens width), the lenticular concave lens 111 may have an aspect ratio of about 1 to 3, for example, an aspect ratio of about 1.5 to about 2.5. The high-refractive resin layer 110 may have a thickness of about 5 μm to about 80 μm.

A space that is occupied by the lenticular concave lens 111 within the color display film may be filled with air. Here, since the air has a refractive index of about 1, a high refractive index difference with the high-refractive resin layer may exist without using the low-refractive transparent resin to provide an improved color display effect. In addition, since a separate filling process is not needed, process efficiency may be improved.

Figure 3:
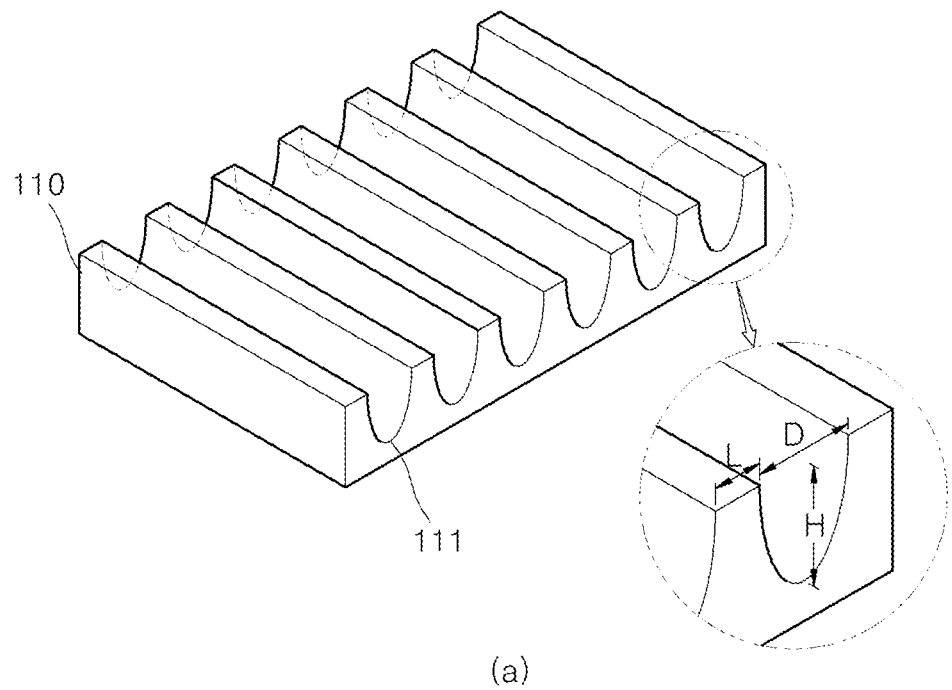
FIG. 3A is a perspective view of an optical pattern of which lenticular concave lenses adjacent to each other are spaced by a desired (or, alternatively, predetermined) distance from each other.
FIG. 3B is a cross-sectional view of a color display film including the optical pattern.
Figure 3:
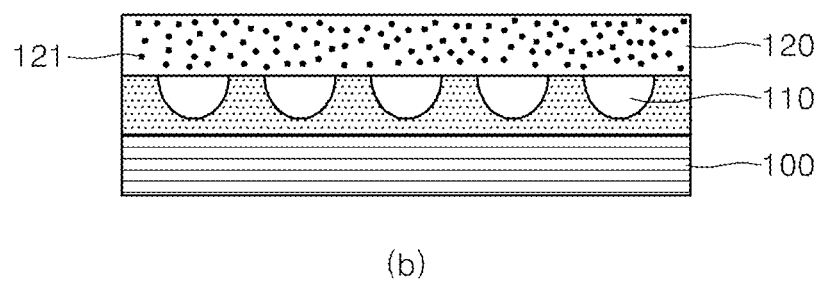

FIG. 3A is a perspective view of an optical pattern of which a plurality of lenticular concave lenses 111 adjacent to each other are spaced by a desired (or, alternatively, predetermined) distance from each other, and FIG. 3B is a cross-sectional view of a color display film including the optical pattern.

According to at least one example embodiment, referring to FIG. 3A, in the optical pattern, the plurality of lenticular concave lenses 111 may be arranged with a constantly spaced distance L between adjacent lenticular concave lenses 111. A ratio L/D of the spaced distance L to the width D of the lenticular concave lens 111 may be about 3.0 or less, for example, about 1.0 to about 2.0. In this range, the improved color display effect according to the viewing angle may be maximized To obtain the improved color display effect, it may be advantageous to use a lens having a high aspect ratio. However, it may be difficult to perform bite processing or roll processing using a bite in order to achieve a high aspect ratio. In addition, in consideration of mass production, yield may be significantly reduced and may decrease economic feasibility. Accordingly, the color display film according to an example embodiment may introduce the low-refractive light diffusion layer to achieve improved color display effects even though an optical pattern having a relatively small aspect ratio is used.

The low-refractive light diffusion layer 120 may be stacked on a surface on which the optical pattern of the high-refractive resin layer 110 is formed. The low-refractive light diffusion layer 120 may be formed of a light diffuser 121 and a UV hardening transparent resin having a refractive index of about 1.35 to about 1.45.

An organic-based light diffuser or an inorganic-based light diffuser may be used as the light diffuser 121 contained in the low-refractive light diffusion layer 120. Alternatively, the organic-based light diffuser and the inorganic-based light diffuser may be mixed with each other to improve diffusion and transmission. One of acrylic-based particles, siloxane-based particles, melamine-based particles, polycarbonate-based particles, and styrene-based particles, or a mixture thereof may be used as the organic-based light diffuser. The organic-based light diffuser may include particles each of which is substantially spherical and has an average particle size D50 of about 2 μm to about 20 μm. The inorganic-based light diffuser may be added to reduce or alternatively prevent a whiteness index of a final resin compound from being reduced when the spherical organic-based light diffuser is added, and to increase light diffusion. In this case, since processability is reduced as an added amount of inorganic-based light diffuser increases, an adequate amount of inorganic-based light diffuser may be added. For example, calcium carbonate, barium sulfate, titanium dioxide, aluminum hydroxide, silica, glass, talcum, mica, white carbon, magnesium oxide, zinc oxide, and the like may be used as the inorganic-based light diffuser, but is not limited thereto.

For example, the organic-based light diffuser may include polymer particles that are coated with a black dye. However, when the polymer particles that are coated with the black dye are used alone, light transmittance may be reduced, thereby reducing brightness. Thus, silicon particles, acrylic-based particles, or a mixture thereof may be further added as non-coated particles. That is, the polymer particles that are coated with the black dye and the non-coated polymer particles may be mixed with a proper amount to adjust brightness, a change in color difference according to a viewing angle, a contrast ratio, and a reflective color. For example, poly methyl methacrylate (PMMA) particles that are coated with the black dye and the non-coated polymer particles which are mixed at a weight ratio of about 1:4 to about 4:1 may be used as the light diffuser.

Particularly, in a case where the optical pattern is a lenticular concave lens pattern, color sense improvement of the panel in a horizontal direction may be enabled in itself. However, it may be difficult to obtain satisfactory effects due to a shape of the lenticular concave lens that is arranged in a vertical direction.

When the light diffuser 121 described in the color display film according to an example embodiment is added to the low-refractive light diffusion layer 120, the color display in the horizontal and vertical directions may be improved.

The light diffuser 121 may be include in the low-refractive light diffusion layer 120 at about 0.1 weight % to about 10 weight %. The low-refractive light diffusion layer 120 may help the light diffusion and the color improved display effect as well as an adhesion force with an adhesive layer that may be additionally stacked on the low-refractive light diffusion layer 120. Thus, reliability of the display panel may be improved. When the low-refractive light diffusion layer 120 is not provided, since only a small surface area of the high-refractive resin layer 110, except for the area that is occupied by the imprinted optical pattern of the entire surface, is used as an area for adhesion, the adhesion force may be reduced. Thus, the film may be bent or delaminated.

A UV hardening transparent resin, such as a transparent polymer resin, may be used as a basic resin for one or both of the high-refractive resin layer 110 and the low-refractive light diffusion layer 120. A resin having an acrylate-based functional group, for example, a polyester resin, a polyether resin, an acrylic resin, an epoxy resin, a urethane resin, an alkyd resin, a spiroacetalg resin, a polybutadiene resin, a poly-thiol polyene resin, and a (meta) acrylate resin of a polyfunctional compound such as polyhydric alcohol, which have a relatively small molecular weight, may be used as the UV hardening transparent resin.

Examples of the UV hardening transparent resin may also include ethylene glycol diacrylate, neopentyl glycol di(meth) acrylate, 1,6-hexanediol (meth)acrylate, trimethyol propane tri(meth)acrylate, di-pentaerythritol hexa(meth)acylate, polyolpoly(meth)acrylate, di(meth)acylate of bis phenol A-diglycidyl ether, polyester(meth)acrylate that is obtained by esterifying polyhydric alcohol, polyhydric carboxylic acid, and an anhydride thereof, and acrylic acid, polysiloxane poly acrylate, urethane (meth)acrylate, pentaerythritol tetramethacrylate, and glyceryl tri methacrylate, but is not limited thereto.

Figure 4:
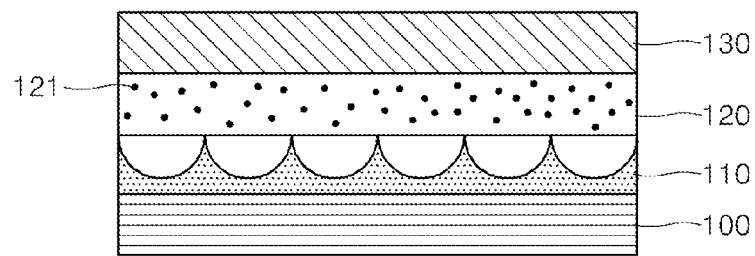
FIG. 4 is a cross-sectional view of a color display film according to another example embodiment.

FIG. 4 illustrates a color display film according to another example embodiment.

According to at least one example embodiment, referring to FIG. 4, an adhesive layer 130 may be further stacked on a light incident surface of the low-refractive light diffusion layer 120. Incident light may successively pass through the adhesive layer 130, the low-refractive light diffusion layer 120, the high-refractive resin layer 110, and the base material layer 100. A general adhesive may be provided as the adhesive layer 130.

The color display films according to the example embodiment may have the above-described structural feature. Thus, the color display films may have a smaller change in white angle dependency (WAD) according to a viewing angle, and thus, the WAD according to the viewing angle may be uniformly used.

Method for Manufacturing a Color Display Film

The method will be described with reference to FIG. 1.

Referring to FIG. 1, a method for manufacturing a color display film according to an example embodiment includes forming a high-refractive resin layer 110 by coating a high-refractive transparent resin on one surface of a base material layer 100 and forming an imprinted optical pattern on the coated high-refractive transparent resin, dispersing a light diffuser 121 into a low-refractive transparent resin to manufacture a low-refractive light diffusion layer 120, and bonding one surface of the low-refractive light diffusion layer 120 to a surface on which the optical pattern of the high-refractive resin layer 110 is formed.

As illustrated in FIG. 4, a method for manufacturing a color display film according to another example embodiment may further include applying an adhesive on the other surface of the low-refractive light diffusion layer 120 to form an adhesive layer 130.

A UV hardening transparent resin may be used as the transparent resin. The high-refractive transparent resin may have a refractive index of about 1.50 to about 1.60. The low-refractive transparent resin may have a refractive index of about 1.35 to about 1.45.

In the high-refractive resin layer 110, the imprinted optical pattern may be formed by using a hard mold method using an engraving roll in which the optical pattern is engraved, or using a soft mold method using a film in which the optical pattern is engraved after the high-refractive transparent resin is coated on one surface of the base material layer 100.

The low-refractive light diffusion layer 120 may be formed by sufficiently dispersing a light diffuser 121 into the low-refractive UV hardening transparent resin, and bonding the low-refractive UV hardening transparent resin to the surface on which the optical pattern of the high-refractive resin layer 110 is formed, using a flat roll.

The low-refractive light diffusion layer 120 may have a thickness of about 10 μm to about 30 μm, not counting the thickness of a lens. When the thickness of the low-refractive light diffusion layer 120 exceeds about 30 μm, an excessive amount of diffuser may increase light scattering, and thereby deteriorate light transmittance. When the thickness of the low-refractive light diffusion layer 120 is less than about 10 μm, the low-refractive light diffusion layer 120 may have a rough surface due to size of the diffuser. Thus, it may be difficult to sufficiently ensure both an adhesion force and light diffusion.

Organic Light-Emitting Device Display Apparatus

Figure 6:
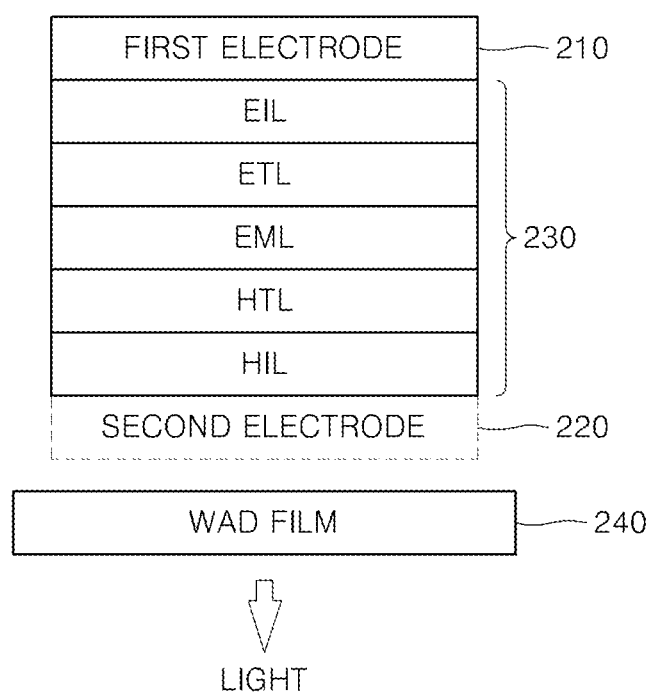
FIG. 6 is a cross-sectional view of an organic light-emitting device display apparatus according to an example embodiment.

FIG. 6 illustrates an organic light-emitting device display apparatus according to an example embodiment.

According to at least one example embodiment, referring to FIG. 6, the organic light-emitting device display apparatus may include a first electrode 210, a second electrode 220 facing the first electrode 210, an organic light emission film 230 disposed between the first and second electrodes 210 and 220, and a color display film 240 disposed on a light emission surface of the second electrode 220. The first electrode 210 may be an anode, and the second electrode 220 may be a cathode. Each of the first and second electrodes 210 and 220 may include a transparent electrode or a reflective electrode. The organic light emission film 230 may be formed by sequentially stacking a hole injection layer (HIL), a hole transport layer (HTL), an emission layer (EML), an electron transport layer (ETL), and an electron injection layer (EIL).

The organic light-emitting device display apparatus may have a resonant structure to display an image using a color reflected from each pixel of the organic light emission film 230.

Figure 7:
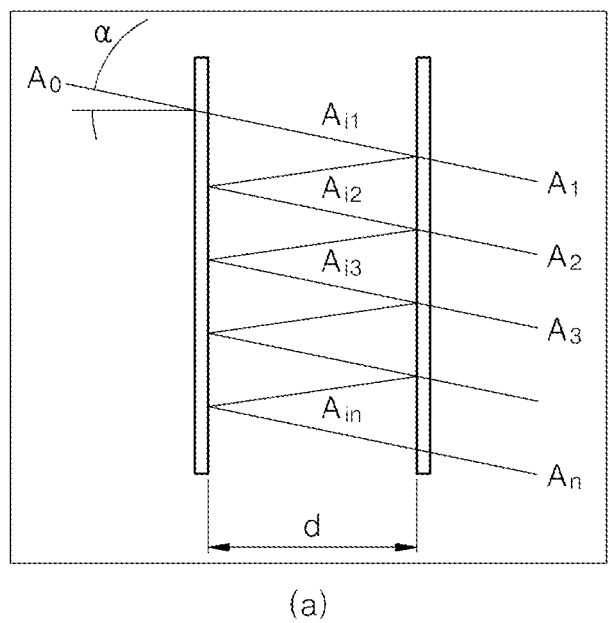
FIG. 7A is a conceptual view for explaining a resonant structure of the organic light-emitting device display apparatus according to an example embodiment.
FIG. 7B is a graph illustrating transmittance distribution according to a light wavelength.
Figure 7:
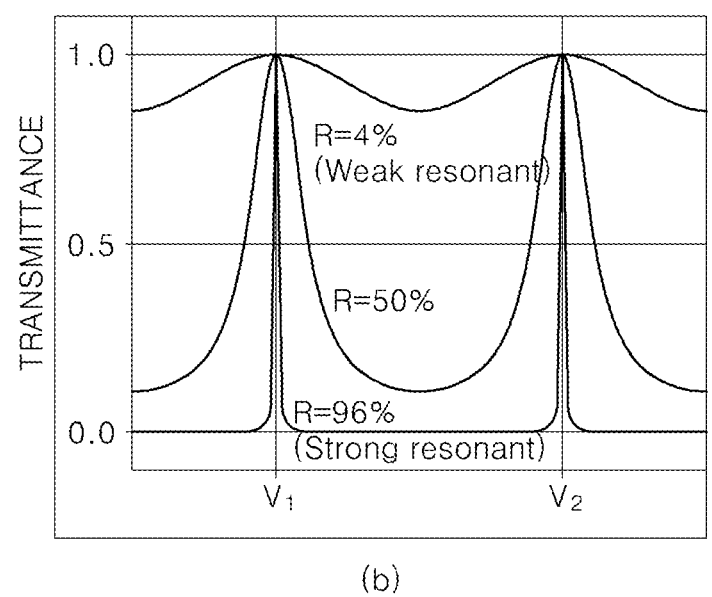

FIG. 7A is a conceptual view for explaining a resonant structure of the organic light-emitting device display apparatus according to an example embodiment.

Referring again to FIG. 6, a structure surrounded by the first and second electrodes 210 and 220 may be defined as a cavity. As illustrated in FIG. 7A, light emitted from the EML may be repeatedly reflected within the cavity between the first and second electrodes 210 and 220. As illustrated in FIG. 7B, the reflection may be continuous to amplify luminescence intensity in a specific wavelength region. Referring to FIG. 7B, a strong resonant structure may have a very narrow light wavelength region when compared to the light wavelength region of a weak resonant structure. Also, a luminescence direction is narrowed as front luminescence intensity increases. That is, the color purity and front brightness may increase, but the viewing angle may be narrowed. Thus, a color shift phenomenon may occur. By the color shift phenomenon, the display that is displayed as a white color at the front side is displayed as a blue-like color as a viewing angle increases. The color shift may be defined as white angle dependency (WAD). To adjust the color shift, the above-described color display film may be introduced.

Hereinafter, a composition and effect of the color display film according to an example embodiment will be described in detail with reference to the method for manufacturing the color display film according to various example embodiments. Since the following embodiments are examples, the embodiments are not limited to the following.

Since contents that are not disclosed herein are sufficiently known to a person skilled in the art, their descriptions will be omitted.

EXAMPLE EMBODIMENTS

Example Embodiment 1

After the color display film in which respective following layers are stacked is manufactured, physical properties of the color display film may be evaluated and expressed in Table 1 below. Also, ΔU'V' values according to a viewing angle are expressed in the graph of FIG. 5.

Base material layer 100: a TAC film may be used as the base material layer, and the base material layer has a thickness of about 60 μm.

High-refractive resin layer 110 on which optical pattern is formed: an imprinted optical pattern is formed on one surface of the high-refractive resin layer 110 that is manufactured by using a UV hardening transparent acrylic-based resin (A company, RS1400). The high-refractive resin layer 110 has a refractive index of about 1.52 and a thickness of about 50 μm. The optical pattern is constituted by a plurality of lenticular concave lenses 111, and each of the lenticular concave lenses 111 has a width of about 10 μm, a depth of about 20 μm, and an aspect ratio of about 2.0. A space that is occupied by the lenticular concave lenses 111 is filled with air.

Low-refractive light diffusion layer 120: the low-refractive light diffusion layer 120 may be manufactured by using a UV hardening transparent acrylic resin (Sin A T&C company, SSC-3802, a refractive index of about 1.39) containing a light diffuser 121, and the high-refractive light diffusion layer 120 has a refractive index of about 1.39 and a thickness of about 30 μm. The light diffuser 121 (J company, SL-200, an average diameter size D50 of about 2 μm) at a concentration of 3 weight % is used in the low-refractive light diffusion layer 120.

Example Embodiment 2

After the same color display film as that of Example Embodiment 1 except for about 5 weight % of the light diffuser 121 is manufactured, physical properties may be evaluated an expressed in Table 1 below.

Comparative Example 1

After the same color display film as that of Example Embodiment 1 is manufactured, except that the low-refractive light diffusion layer 120 does not include the light diffuser 121, physical properties may be evaluated and expressed in Table 1 below.

Method for Evaluating Physical Property

Light transmittance (%) and light scattering (%): after the manufactured film is cut by a size of about 5 cm*5 cm, the light transmittance and light scattering are measured by using NDH5000W of the N company on the basis of ASTM D1003 regulations.

Color shift rate (ΔU'V'): after the films according to the example embodiment and comparative example are cut by a size of about 20 cm*20 cm, the cut films are attached to an OLED television by a measuring device (EZcontrast (E company)) to measure the color shift rate at an interval of about 1° from about 0° to about 60° with respect to a center of the panel, thereby obtaining spectrum.

Values of the color shift rate ΔU'V' to a viewing angle of about 0° are calculated by using the measured results to express the values of the color shift rate ΔU'V' according to the viewing angle as the graph of FIG. 4. A state in which the film is not attached may be in a bare panel state.

Adhesion force evaluation: after the films according to Embodiments and Comparative Examples are cut by a size of about 5 inch*1 inch, a force required for pulling and striping the films in a direction of an angle of about 180° is measured using a measuring device (5944) of an I company.

TABLE 1

| | | Embodiment 1 | Embodiment 2 | Comparative Example 1 |
|---|---|---|---|---|
| Refractive index | High-refractive resin layer | 1.52 | 1.52 | 1.52 |
| | Low-refractive light diffusion layer | 1.39 | 1.39 | 1.39 |
| Concave lens aspect ratio (H/D) | | 2.0 | 2.0 | 2.0 |
| Light diffuser (weight %) | | 3 | 5 | — |
| Light transmittance (%) | | 86.45 | 88.06 | 92.65 |
| Light scattering (%) | | 45.78 | 54.84 | 36.99 |
| ΔU'V' | 0° | 0 | 0 | 0 |
| | 20° | 0.004 | 0.004 | 0.007 |
| | 40° | 0.017 | 0.013 | 0.022 |
| | 60° | 0.023 | 0.017 | 0.028 |
| Adhesion force (gf/in) | | 129.5 | 118.2 | 39.8 |

Figure 5:
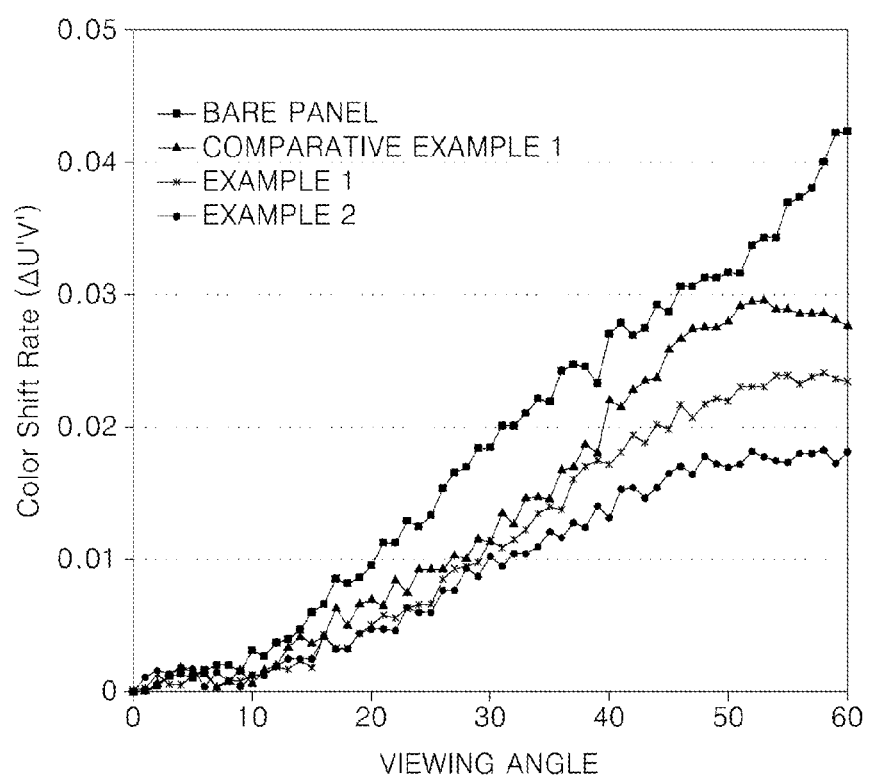
FIG. 5 is a graph illustrating ΔU'V' values according to viewing angles of color display films according to an example embodiment and a comparative example.

Referring to Table 1 and FIG. 5, it is seen that the light scattering is further improved by adding the light diffuser in Example Embodiments 1 and 2 when compared to that of Comparative Example 1. Also, it is seen that the ΔU'V' value according to the viewing angle is reduced to improve the improved color display effect.

Also, the adhesion force of the adhesion layer in Example Embodiments 1 and 2 may be significantly improved than the adhesion force in Comparative Example 1 to reduce or alternatively prevent the panel from being delaminated, and thus, the reliability of the display panel may be improved.

The color display film according to an example embodiment may have a less color shift according to the viewing angle and improved light transmission and diffusion and improved reliability. Thus, the method for manufacturing the color display film may be improved in processability and economic feasibility.

It should be understood that the example embodiments described therein should be considered in a descriptive sense only and not for purposes of limitation. Descriptions of features or aspects within each embodiment should typically be considered as available for other similar features or aspects in other example embodiments.

While one or more example embodiments have been described with reference to the figures, it will be understood by those of ordinary skill in the art that various changes in form and details may be made therein without departing from the spirit and scope of the example embodiments as defined by the following claims.

What is claimed is:

1. A color display film comprising:
   a base material layer;
   a high-refractive resin layer having an optical pattern, the high-refractive resin layer not including any light diffuser; and
   a low-refractive light diffusion layer comprising a light diffuser,
   wherein the base material layer, the high-refractive resin layer, and the low-refractive light diffusion layer are in a stacked configuration,
   the optical pattern is in a surface of the high-refractive resin layer facing the low-refractive light diffusion layer,
   wherein the high-refractive resin layer and the low-refractive light diffusion layer are configured so as to include a plurality of air cavities configured by a lower surface of the low-refractive light diffusion layer and the surface of the high-refractive resin layer.

2. The color display film of claim 1, wherein the high-refractive resin layer comprises an ultraviolet hardening transparent resin having a refractive index of 1.50 to 1.60.

3. The color display film of claim 1, wherein the low-refractive light diffusion layer comprises an ultraviolet hardening transparent resin having a refractive index of 1.35 to 1.45.

4. The color display film of claim 1, wherein the optical pattern is constituted by a plurality of lenticular concave lenses, and each of the lenticular concave lenses has a width of 1 um to 1,000 um, a depth of 1 um to 2,000 um, and an aspect ratio of 1 to 3.

5. The color display film of claim 4, wherein:
   each of the plurality of lenticular concave lenses are spaced apart by a distance, and a ratio of the distance to the width of the lenticular at least one concave lens is less than or equal to 3.0.

6. The color display film of claim 1, wherein at least one of the high-refractive resin layer and the low-refractive resin layer comprises an ultraviolet hardening resin having an acrylate-based functional group.

7. The color display film of claim 1, wherein:
   the light diffuser is one of an organic-based light diffuser, an inorganic-based light diffuser, and a mixture thereof,
   the organic-based light diffuser comprises at least one of acrylic-based particles, siloxane-based particles, melamine-based particles, polycarbonate-based particles, and styrene-based particles, and
   the inorganic-based light diffuser comprises at least one of calcium carbonate, barium sulfate, titanium dioxide, aluminum hydroxide, silica, glass, talcum, mica, white carbon, magnesium oxide, and zinc oxide.

8. The color display film of claim 7, wherein the organic-based light diffuser has an average particle size of 2 um to 20 um.

9. The color display film of claim 8, wherein:
   the organic-based light diffuser comprises polymer particles that are coated with a black dye, and non-coated particles,
   the polymer particles that are coated with the black dye comprise poly methyl methacrylate (PMMA) particles, and the non-coated particles comprise one of silicon particles, acrylic-based particles, and a mixture thereof.

10. The color display film of claim 9, wherein the organic-based light diffuser comprises the polymer particles that are coated with the black dye and the non-coated particles, mixed at a weight ratio of 1:4 to 4:1.

11. The color display film of claim 1, wherein the light diffusion layer comprises the light diffuser at a concentration of 0.1 weight % to 10 weight %.

12. The color display film of claim 1, wherein:
the base material layer has a thickness of 30 um to 100 um, the high-refractive resin layer has a thickness of 5 um to 80 um, and the low-refractive light diffusion layer has a thickness of 5 um to 50 um.

13. The color display film of claim 1, wherein an adhesive layer is further stacked on one surface of the low-refractive light diffusion layer.

14. The color display film of claim 1, wherein the base material layer comprises triacetate cellulose (TAC), polyethylene terephthalate (PET), polycarbonate (PC), or polyvinyl chloride (PVC).

15. An organic light-emitting device display apparatus comprising:
a first electrode;
a second electrode facing the first electrode;
an organic light emission film disposed between the first electrode and the second electrode; and
the color display film of claim 1 disposed on a light emission surface of the second electrode,
wherein the organic light-emitting device display apparatus has a resonant structure to display an image by using a color reflected from each pixel of the organic light emission film.

16. The apparatus of claim 15, wherein the organic light emission film comprises a stacked configuration of a hole injection layer (HIL), a hole transport layer (HTL), an emission layer (EML), an electron transport layer (ETL), and an electron injection layer (EIL).

17. A method for manufacturing a color display film, the method comprising:
forming a high-refractive resin layer by coating a high-refractive transparent resin on one surface of a base material layer and forming an imprinted optical pattern on the coated high-refractive transparent resin, wherein the high-refractive resin layer not including any light diffuser;
forming a low-refractive light diffusion layer by dispersing a light diffuser into a low-refractive transparent resin;
bonding one surface of the low-refractive light diffusion layer on a surface of the high-refractive resin layer on which the imprinted optical pattern is formed; and
the imprinted optical pattern is in a surface of the high-refractive resin layer facing the low-refractive light diffusion layer, and
the high-refractive resin layer and the low-refractive light diffusion layer are configured so as to include a plurality of air cavities configured by a lower surface of the low-refractive light diffusion layer and the surface of the high-refractive resin layer.

18. The method of claim 17, further comprising forming an adhesive layer by coating an adhesive on another surface of the low-refractive resin layer.

19. The method of claim 17, wherein:
the high-refractive transparent resin comprises an ultraviolet hardening transparent resin having a refractive index of 1.50 to 1.60, and the low-refractive transparent resin comprises an ultraviolet hardening transparent resin having a refractive index of 1.35 to 1.45.

* * * * *